(12) United States Patent
Marzaki et al.

(10) Patent No.: US 10,971,578 B2
(45) Date of Patent: Apr. 6, 2021

(54) CAPACITIVE ELECTRONIC CHIP COMPONENT

(71) Applicant: STMICROELECTRONICS (ROUSSET) SAS, Rousset (FR)

(72) Inventors: Abderrezak Marzaki, Aix en Provence (FR); Pascal Fornara, Pourrières (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/596,673

(22) Filed: Oct. 8, 2019

(65) Prior Publication Data
US 2020/0111866 A1 Apr. 9, 2020

(30) Foreign Application Priority Data
Oct. 8, 2018 (FR) ...................................... 1871140

(51) Int. Cl.
| | |
|---|---|
| H01L 49/02 | (2006.01) |
| H01L 21/02 | (2006.01) |
| H01L 21/283 | (2006.01) |
| H01L 21/306 | (2006.01) |
| H01L 27/11521 | (2017.01) |
| H01L 27/11531 | (2017.01) |
| H01L 27/06 | (2006.01) |
| H01L 27/10 | (2006.01) |

(52) U.S. Cl.
CPC .......... *H01L 28/60* (2013.01); *H01L 21/0217* (2013.01); *H01L 21/02164* (2013.01); *H01L 21/02236* (2013.01); *H01L 21/283* (2013.01); *H01L 21/30604* (2013.01); *H01L 27/0629* (2013.01); *H01L 27/101* (2013.01); *H01L 27/11521* (2013.01); *H01L 27/11531* (2013.01); *H01L 28/40* (2013.01); *H01L 21/02255* (2013.01)

(58) Field of Classification Search
CPC ............................... H01L 28/60; H01L 27/101
See application file for complete search history.

(56) References Cited

U.S. PATENT DOCUMENTS

| | | | |
|---|---|---|---|
| 5,581,110 | A | 12/1996 | Razouk et al. |
| 5,805,494 | A | 9/1998 | El-Kareh et al. |
| 6,391,707 | B1 | 5/2002 | Dirnecker et al. |

(Continued)

FOREIGN PATENT DOCUMENTS

| | | |
|---|---|---|
| EP | 1 335 425 A1 | 8/2003 |
| FR | 3 013 148 A1 | 5/2015 |

(Continued)

OTHER PUBLICATIONS

La Rosa et al., "40nm embedded Select in Trench Memory (eSTM) Technology Overview," 2019 IEEE 11th International Memory Workshop, 4 pages.

*Primary Examiner* — Farun Lu
(74) *Attorney, Agent, or Firm* — Seed Intellectual Property Law Group LLP (57) ABSTRACT

The disclosure concerns a capacitive component including a trench and, vertically in line with the trench, first portions of a first silicon oxide layer and first portions of second and third conductive layers including polysilicon or amorphous silicon, the first portion of the first layer being between and in contact with the first portions of the second and third layers.

20 Claims, 5 Drawing Sheets

(56) References Cited

U.S. PATENT DOCUMENTS

| | | |
|---|---|---|
| 7,428,175 B2 | 9/2008 | Malinge et al. |
| 7,449,744 B1 | 11/2008 | Yu et al. |
| 8,085,524 B2 | 12/2011 | Roozeboom et al. |
| 8,492,820 B2 | 7/2013 | Anderson et al. |
| 8,525,245 B2 | 9/2013 | Erickson et al. |
| 9,082,609 B2 * | 7/2015 | Marinet ............... H01L 28/60 |
| 9,159,723 B2 | 10/2015 | Chou et al. |
| 9,349,793 B2 | 5/2016 | Jaffe et al. |
| 9,978,829 B2 | 5/2018 | Lin |
| 10,032,673 B1 * | 7/2018 | Chen ................. H01L 27/0629 |
| 10,049,890 B2 | 8/2018 | Chou et al. |
| 10,084,035 B2 | 9/2018 | Papavasiliou et al. |
| 10,109,601 B2 | 10/2018 | Marzaki |
| 2006/0124987 A1 | 6/2006 | Won et al. |
| 2007/0054461 A1 | 3/2007 | Su |
| 2007/0278612 A1 | 12/2007 | Williams et al. |
| 2009/0039466 A1 | 2/2009 | Sanada |
| 2009/0095995 A1 * | 4/2009 | Kawashima ...... H01L 27/11526 257/296 |
| 2011/0018094 A1 | 1/2011 | Chapman et al. |
| 2012/0032260 A1 | 2/2012 | Hirler et al. |
| 2013/0069198 A1 | 3/2013 | Claeys et al. |
| 2013/0161792 A1 | 6/2013 | Tran et al. |
| 2014/0024183 A1 | 1/2014 | Hsu et al. |
| 2014/0145299 A1 | 5/2014 | Kalnitsky et al. |
| 2014/0264523 A1 | 9/2014 | Loechelt et al. |
| 2015/0061075 A1 | 3/2015 | Yeh |
| 2015/0236031 A1 | 8/2015 | Mantelli et al. |
| 2016/0020267 A1 | 1/2016 | Lin |
| 2016/0218071 A1 | 7/2016 | Nam et al. |
| 2017/0186837 A1 | 6/2017 | Yen et al. |

FOREIGN PATENT DOCUMENTS

| | | |
|---|---|---|
| FR | 3 021 457 A1 | 11/2015 |
| FR | 2 894 708 A1 | 6/2017 |

* cited by examiner

CAPACITIVE ELECTRONIC CHIP COMPONENT

BACKGROUND

Technical Field

The present disclosure generally concerns electronic devices and, in particular, a capacitive component of an electronic integrated circuit chip and an electronic chip comprising such a capacitive component.

Description of the Related Art

An electronic integrated circuit chip generally comprises transistors and/or memory cells. Such a chip further often comprises capacitive components.

BRIEF SUMMARY

An embodiment overcomes all or part of the disadvantages of known electronic chips.

An embodiment overcomes all or part of the disadvantages of known electronic chip capacitive components.

An embodiment provides a capacitive component comprising a trench and, vertically in line with the trench, first portions of a first silicon oxide layer and first portions of second and third conductive layers comprising polysilicon or amorphous silicon, the first portion of the first layer being between and in contact with the first portions of the second and third layers.

According to an embodiment, the first portion of the second layer is located vertically in line with the first portion of the third layer.

According to an embodiment, the first portions of the first, second and third layers form a stack.

According to an embodiment, the sides of the first portions of the first, second and third layers correspond to the sides of said stack.

According to an embodiment, said stack is entirely located above the trench.

According to an embodiment, the capacitive component comprises an insulating layer located in the trench.

According to an embodiment, the insulating layer totally fills the trench.

According to an embodiment, the trench is filled with a polysilicon wall separated from the trench walls by the insulating layer.

According to an embodiment, the periphery of the first portion of second layer is separated from the first portion of third layer by an annular portion of an oxide-nitride-oxide three-layer structure.

An embodiment provides an electronic chip comprising a first capacitive component such as defined hereinabove.

According to an embodiment, the chip further comprises a transistor gate comprising a second portion of the second layer and resting on a second portion of the first layer.

According to an embodiment, the chip comprises a second capacitive component such as defined hereinabove, the second and third layers of the first and second capacitive components being common, and the first layers having different thicknesses.

According to an embodiment, the chip comprises an additional capacitive component comprising a first portion of an oxide-nitride-oxide three-layer structure between additional portions of the second and third layers.

According to an embodiment, the chip comprises a second portion of the three-layer structure located between floating and control gates of a memory cell, the floating and control gates preferably comprising portions, respectively, of the second and third layers.

An embodiment provides a method of forming a capacitive component, comprising forming a trench and, vertically in line with the trench, first portions of a first silicon oxide layer and first portions of second and third conductive layers comprising polysilicon or amorphous silicon, the first portion of the first layer being between and in contact with the first portions of the second and third layers.

According to an embodiment, the first portions of the first, second and third layers form a stack, the stack being obtained from the first, second and third layers by etching the regions surrounding the stack.

According to an embodiment, the method is an electronic chip forming method.

According to an embodiment, the method comprises simultaneously forming the first layer and at least a portion of a gate insulator of a transistor.

According to an embodiment, the method comprises simultaneously forming the second layer and at least a portion of a floating gate of a memory cell.

According to an embodiment, the method comprises simultaneously forming the third layer and at least a portion of a transistor gate.

The foregoing and other features and advantages will be discussed in detail in the following non-limiting description of specific embodiments in connection with the accompanying drawings.

DETAILED DESCRIPTION

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the components of transistors and of memory cells other than gates and gate insulators are neither described nor shown, the embodiments described herein being compatible with ordinary transistors and memory cells.

Throughout the present disclosure, the term "connected" is used to designate a direct electrical connection between circuit components with no intermediate components other than conductors, whereas the term "coupled" is used to designate an electrical connection between circuit components that may be direct, or may be via one or more intermediate components.

In the following description, when reference is made to terms qualifying absolute positions, such as terms "top", "bottom", "left", "right", etc., or relative positions, such as terms "above", "under", "upper", "lower", etc., or to terms qualifying directions, such as terms "horizontal", "vertical", etc., unless otherwise indicated, it is referred to the orientation of the drawings.

The terms "about", "substantially", and "approximately" are used herein to designate a tolerance of plus or minus 10%, preferably of plus or minus 5%, of the value in question.

FIGS. 1A-2F show six successive steps S1, S2, S3, S4, S5, and S6 of an embodiment of an electronic chip forming method. Each step is illustrated by a partial simplified cross-section view of a structure obtained after this step. The chip obtained by this method comprises transistors, memory cells, and capacitive components. The transistors typically comprise a gate separated by a gate insulator from a channel region located between drain and source regions. The memory cells typically comprise a transistor having a floating gate topped with a control gate.

Figure 1A:
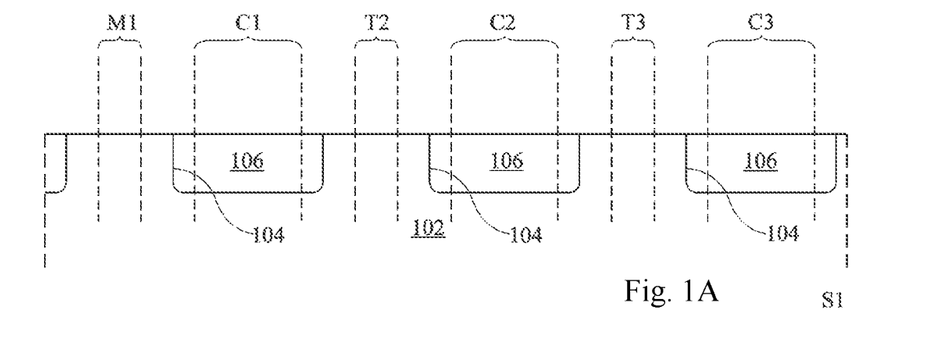
FIGS. 1A-1C shows three steps of an embodiment of an electronic chip forming method.

At step S1 of FIG. 1A, a semiconductor substrate 102, preferably made of silicon, is provided. Trenches 104 are formed in substrate 102 from the front surface (or upper surface) thereof. Trenches 104 have a depth for example greater than 100 nm, preferably greater than 300 nm. In the present embodiment, the trenches are filled with an electrically insulating layer, for example, silicon oxide. The trenches are preferably totally filled with the insulating layer. Preferably, after filling, the portions of the insulating layer located outside of the trenches are removed. The insulator portions 106 located in the trenches may be flush with the front surface of substrate 102. As a variation, the tops of these portions are located above the front surface of substrate 102.

The next steps S2 to S6 of the method as shown in FIGS. 1B-2C aim at the forming of capacitive components in respective portions C1, C2, and C3 located on insulator 106 of trenches 104. Preferably, in portions M1, T2, and T3 located on regions of the substrate delimited by trenches 104, steps S2 to S6 further aim at forming:
  in portion M1, a stack of floating and control gates of a memory cell, separated by a first gate insulator;
  in portion T2, a transistor gate insulated by a second gate insulator; and
  in portion T3, a transistor gate insulated by a third gate insulator.

The elements formed during steps S2 to S6 have been shown only in portions C1, C2, C3, M1, T2, and T3 of the electronic chip. The forming and the possible removal of elements located outside of portions C1, C2, C3, M1, T2, and T3 are not described and are within the abilities of those skilled in the art based on the present description, the steps described herein being compatible with usual electronic chip manufacturing methods.

Figure 1B:
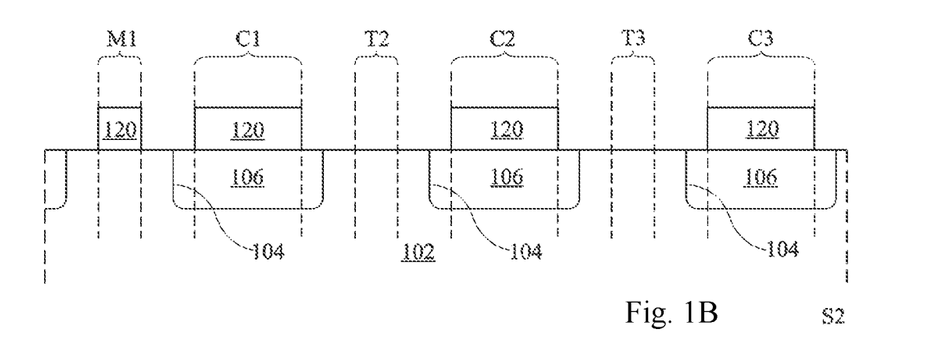

At step S2 shown in FIG. 1B, an electrically-conductive layer 120 comprising polysilicon or amorphous silicon has been formed on the structure obtained at step S1. The silicon preferably comprises crystals having, in a direction parallel to the front surface, a size smaller than approximately 200 nm, for example, 200 nm, or smaller than the thickness of layer 120. Layer 120 preferably has a thickness in the range from 100 nm to 150 nm. Layer 120 is totally conductive, that is, comprising no insulating regions. Preferably, layer 120 is only made of doped polysilicon or only made of doped amorphous silicon. As a variation, layer 120 comprises, in addition to polysilicon or amorphous silicon, a conductive layer, for example, metallic. Layer 120 comprises a portion in each of portions M1, C1, C2, and C3. In the present description, a layer portion has the same thickness as the concerned layer.

Portions T2 and T3 have no layer 120. To achieve this, as an example, layer 120 is deposited and then removed from portions T2 and T3 by dry etching by using a mask which does not cover portions T2 and T3.

Figure 1C:
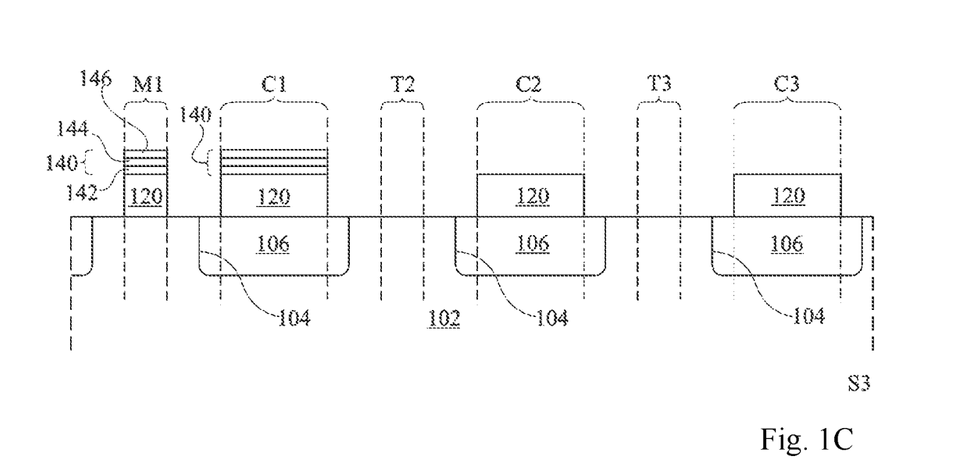

At step S3 shown in FIG. 1C, an oxide-nitride-oxide three-layer structure 140 is deposited. Three-layer structure 140 comprises a portion in each of portions M1 and C1. Three layer structure 140 is successively formed of a silicon oxide layer 142, of a silicon nitride layer 144, and of a silicon oxide layer 146. Each portion of the three-layer structure thus comprises a portion of each layer 142, 144, and 146. Three-layer structure 140 covers and is preferably in contact with the portions of layer 120 located in portions M1 and C1. Portions T2, C2, T3, and C3 do not comprise three-layer structure 140. For this purpose, preferably, three-layer structure 140 is removed after deposition in portions T2, C2, T3, and C3, for example by etching all the way to layer 120 in portions C2 and C3 and all the way to substrate 102 in portions T2 and T3.

Figure 2A:
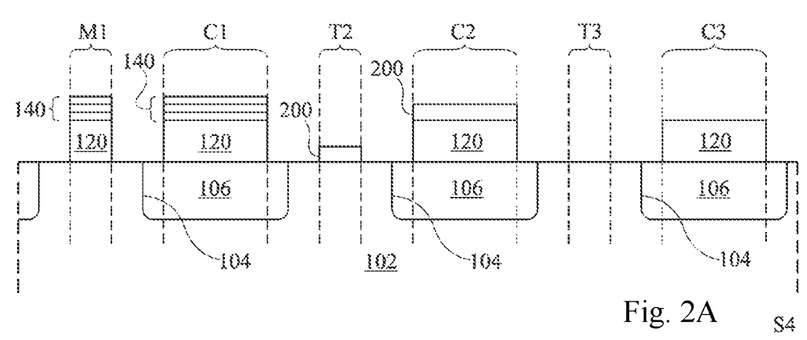
FIGS. 2A-2C shows three other steps of the embodiment of the method of FIGS. 1A-1C.

At step S4 shown in FIG. 2A, a silicon oxide layer 200 having a portion in each of portions C2 and T2 is formed on the structure obtained after step S3. In portion C2, layer 200 is in contact with polysilicon layer 120. In portion T2, layer 200 is preferably in contact with substrate 102, but it may also be provided to form on substrate 102 any additional layer, for example, dielectric, before the forming of layer 200. Preferably, layer 200 is deposited over the entire front surface of the structure, and layer 200 is grown on the front surface in all portions C1, M1, C2, T2, C3, and T3. Layer 200 then corresponds to an increase in the thickness of upper layer 144 of the three-layer structure in portions M1 and C1. Layer 200 is then removed from portions T3 and C3. As an example, layer 200 is obtained by thermal oxidation of the upper surfaces of layer 120 in portions C2 and C3, and of the substrate in portions T2 and T3. The oxide thus formed is then removed from portions T3 and C3.

Figure 2B:
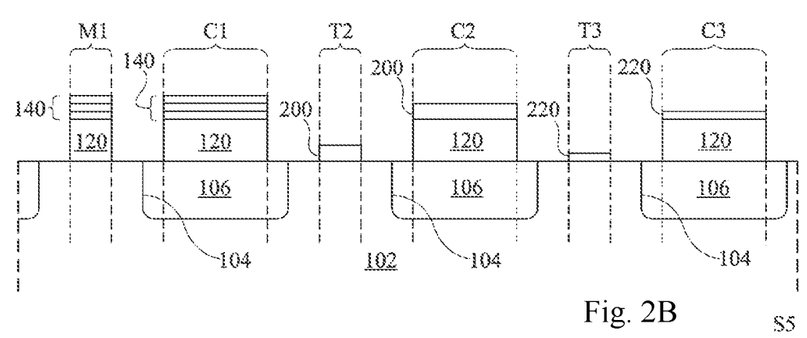

At step S5 shown in FIG. 2B, a silicon oxide layer 220 having a portion in each of portions C3 and T3 is formed on the structure obtained after step S4. In portion C3, layer 220 is in contact with layer 120. In portion T3, layer 220 is preferably in contact with substrate 102, but an additional layer may be provided between substrate 102 and layer 220. Preferably, layer 220 is deposited over the entire front surface of the structure, or layer 220 is grown on the front surface in all portions C1, M1, C2, T2, C3, and T3. Layer 220 then corresponds to a thickness increase of upper layer 144 of three-layer structure 140 in portions M1 and C1. Layer 220 then corresponds to a thickness increase of layer 200 in portions C2 and T2. As an example, layer 220 is obtained by thermal oxidation of the upper surfaces of layer 120 in portion C3, and of the substrate in portion T3. The thermal oxidation may increase the thickness of layer 200.

Preferably, after step S5, the thickness of three layer structure 140 is in the range from approximately 12 nm to approximately 17 nm, preferably in the range from 12 nm to 17 nm, for example, 14.5 nm. Preferably, after step S5, the thickness of layer 200 is in the range from approximately 4 nm to approximately 7 nm, preferably from 4 nm to 7 nm, for example, 5.7 nm. The thickness of layer 220 is preferably smaller than that of layer 200. Preferably, the thickness of layer 220 is in the range from approximately 2 nm to approximately 3 nm, preferably from 2 nm to 3 nm, for example, 2.1 nm.

Figure 2C:
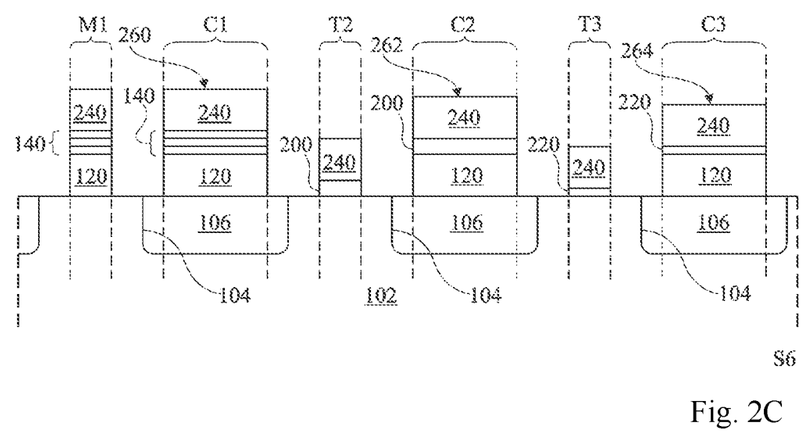

At step S6 shown in FIG. 2C, a conductive layer 240 comprising doped polysilicon or doped amorphous silicon is formed on the structure obtained after step S5. Layer 120 is totally conductive, that is, comprising no insulating regions. Preferably, layer 240 is made of doped polysilicon. As a variation, layer 240 comprises an electrically-conductive sub-layer, for example, metallic, having the polysilicon resting thereon. Layer 240 has a portion in each of portions C1, C2, C3, M1, T2, and T3. The portions of layer 240 are located vertically in line with the portions of layer 120 of portions C1, C2, C3, and M1. Layer 240 is preferably in contact with three layer structure 140 in portions M1 and C1. In portions C2 and C3, layer 240 is respectively in contact with layer 200 and 220. In portion T2, layer 240 is preferably in contact with layer 200, but one or a plurality of additional layers, for example, dielectric, may be provided between layer 200 and layer 240. In portion T3, layer 240 is preferably in contact with layer 220, but one or a plurality of additional layers, for example, dielectric, may be provided between layer 220 and layer 240. Layer 240 preferably has a thickness in the range from 100 nm to 300 nm, for example, 200 nm.

Step S6 provides:
- in portion C1, a capacitive component 260 comprising a stack of a portion of three-layer structure 140 between portions of conductive layer 120 and 240;
- in portion C2, a capacitive component 262 comprising a stack of a portion of dielectric layer 200 between portions of layer 120 and 240;
- in portion C3, a capacitive component 264 comprising a stack of a portion of dielectric layer 220 between portions of layer 120 and 240;
- in portion M1, a stack of a floating gate of a memory cell defined by a portion of layer 120, of a portion of dielectric three-layer structure 140, and of a control gate of the memory cell defined by a portion of layer 240;
- in portion T2, a transistor gate defined by a portion of conductive layer 240, resting on a gate insulator defined by a portion of layer 200; and
- in portion T3, a transistor gate defined by a portion of conductive layer 240, resting on a gate insulator defined by a portion of layer 220.

In the above-described method:
the conductive portions 120 of the capacitive components and the floating gate of the memory cell are simultaneously formed;
the dielectrics of the capacitive components and the gate insulators of the transistors and of the memory cell are simultaneously formed; and
the conductive portions 240 of the capacitive components and the gates of the transistors and of the memory cell are simultaneously formed.

The capacitive components are thus obtained without additional steps with respect to a chip only comprising the transistors and the memory cell.

Due to the fact that capacitive components 260, 262, and 264 comprise conductor-dielectric-conductor stacks located on insulation trenches, the surface area of the chip is decreased with respect to that of a chip having its capacitive components located between insulating trenches.

Capacitive component 260 may be used for high voltages, for example, greater than in the order of 10 V. Such high voltages for example correspond to the programming of a memory cell. Capacitive component 262 may be used for average voltages, for example, in the range from 0 V and in the order of 6.5 V, for example, 5 V. Such average voltages for example correspond to logic levels of digital circuits. Capacitive component 264 may be used for low voltages, for example, in the range from 0 V to in the order of 1.4 V. Such low voltages correspond to filtering applications such as the decoupling, for example, of a power supply voltage, or radio reception. For a same capacitance value, the capacitive components occupy a surface area which is all the smaller as their dielectric thickness is small. Thus, capacitance values greater than in the order of from 12 fF/$\mu$m$^2$ to 20 fF/$\mu$m$^2$, can be obtained for component 264. Preferably, the capacitance value of component 264 is greater than in the order of 18 fF/$\mu$m$^2$. The surface area occupied by the capacitive components of the chip is thus decreased, as compared with a chip only comprising capacitive components adapted to high and/or average voltages.

Further, capacitive components 262 and 264 being located on insulator 106 of the trenches, they are more capable of filtering radio frequencies than capacitive components which would be directly located on a conductor such as a semiconductor substrate, or which would be separated from such a conductor by an insulator having a thickness smaller than that of insulator 106.

In the above-described method, one or a plurality of portions C1, C2, C3, M1, T2, and T3 may be omitted, while keeping at least one of capacitive components 262 and 264.

Figure 3:
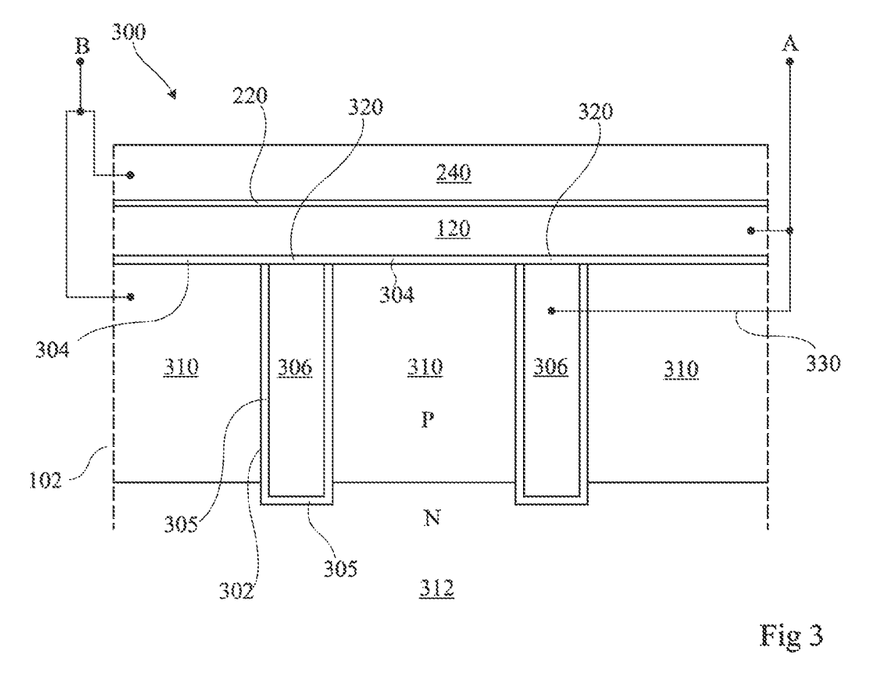
FIG. 3 shows an embodiment of a capacitive electronic chip component.

FIG. 3 shows an embodiment of a capacitive electronic chip component 300.

Capacitive component 300 is similar to component 264 of FIG. 2 where each trench 104 is replaced with one or a plurality of trenches 302, the stack of portions of layers 120, 220, and 240 covering trenches 302 and covering regions of substrate 102 located between and on either side of trenches 302. A layer 304 electrically insulates the substrate regions from the stack. Layer 304 has for example a thickness smaller than in the order of 15 nm, preferably 3.2 nm. Trenches 302 have their walls and their bottoms covered with an electrically-insulating layer 305. The trenches are filled with an electric conductor, preferably doped polysilicon, which then forms in each trench 302 a conductive wall 306 separated from the substrate by insulating layer 305. Layer 305 for example has a thickness in the order of that of layer 304.

Trenches 302 preferably have a depth in the range from 300 nm to 600 nm. The trenches preferably have a width in the range from 0.1 $\mu$m to 0.3 $\mu$m. Layer 120 is for example separated from walls 306 by insulating layer portions 320. Walls 306 and layer 120 are then connected together (connection 330). As a variation, layer 120 is in contact with walls 306. Layer 120 and walls 306 are coupled, preferably connected, to a terminal A of capacitive component 300.

Preferably, trenches 302 delimit P-type doped regions 310 of substrate 102. Regions 310 are preferably located on a common N-type doped region 312. Trenches 302 reach, preferably penetrate into, region 312, so that regions 310 are electrically insulated from one another. Regions 310 are coupled to a terminal B of capacitive component 300. Upper layer 240 is coupled to terminal B.

Capacitive component 300 thus formed between terminals A and B has a capacitance value greater than that of a capacitive component only comprising trenches 302, layer 304, and regions 310, for a same occupied surface area. Further, capacitive component 300 has, for a same occupied surface area, a capacitance value greater than that of a similar capacitive component where layer 220 would be replaced with an oxide-nitride-oxide three-layer structure such as three-layer structure 140.

Preferably, to form a chip comprising capacitive component 300, steps S2 to S6 of the method of FIGS. 1B-2F, where the portions of layers 120, 220, and 240 are simultaneously formed in capacitive components 300 and 264, are implemented. Thus, the portions of layers 120, 220, and 240 of capacitive components 300 and 264 are portions of the same layers 120, 220, and 240.

As a variation, in the method of FIGS. 1A-2F, the forming of capacitive component 264 is replaced with that of capacitive component 300. In another variation, the portion of layer 220 is replaced with a portion of layer 200 in capacitive component 300. Preferably, the portions of layers 120, 200, and 240 are then simultaneously formed in capacitive components 300 and 262. The forming of capacitive component 262 may also be replaced with that of capacitive component 300.

FIGS. 4 to 7 are cross-section views showing schematically steps of an embodiment of a method for forming a capacitive component. As an example, the capacitive component is capacitive component 264 of the method of FIGS. 1A-2F, located in portion C3. The method of FIGS. 4 to 7 focuses more particularly on forming and removing the elements located outside portion C3.

Figure 4:
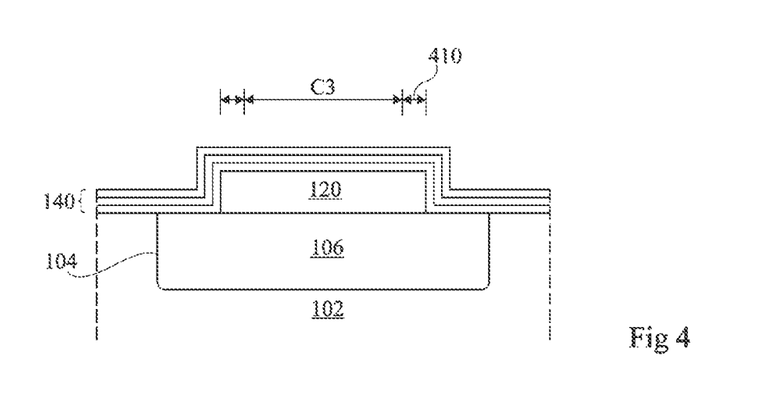
FIGS. 4 to 7 show steps of an embodiment of a method for forming a capacitive component of an electronic ship.
Figure 5:
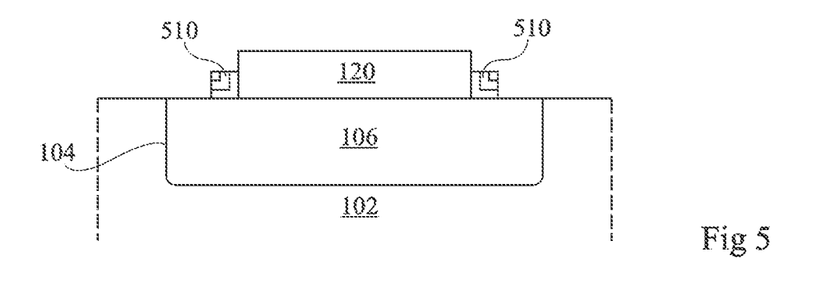

The steps of FIGS. 4 and 5 correspond to step S3 of FIG. 1C. Layer 120 has been formed at step S2 in portion C3. Layer 120 extends across the whole of portion C3 and preferably extends over a part of insulator 106 outside portion C3 (portions 410).

At the step of FIG. 4, three-layer structure 140 is formed inside and outside portion C3. Three-layer structure 140 is formed on the portion of layer 120 located inside portion C3 and is formed also on insulator 106 of trenches 104, preferably in contact with insulator 106. Three-layer structure 140 may be deposited all over the upper surface of the structure obtained at step S2.

At the step of FIG. 5, three-layer structure 140 is etched inside and outside the portion C3. Horizontal parts of layer 140 are completely removed by this etching. However, in practice, portions 510 of layer 140 may remain against the sides of layer 120.

Figure 6:
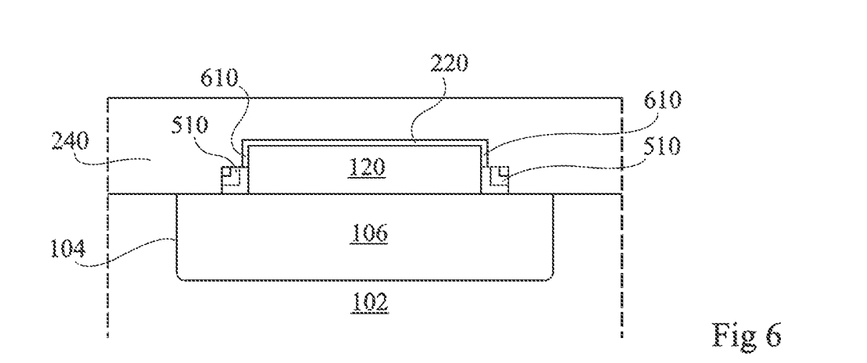
Figure 7:
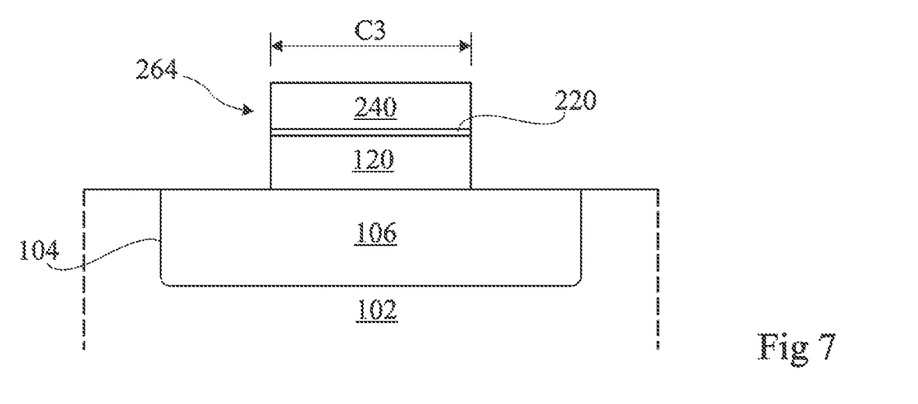

The steps of FIGS. 6 and 7 correspond to step S6 of FIG. 2C. Silicon oxide layer 220 has been formed at step S5 on layer 120. Silicon oxide layer 220 may extend over the sides of layer 120 (portions 610).

At the step of FIG. 6, conductive layer 240 is formed on the structure obtained at step S5. At this step, conductive layer 240 preferably covers the entire upper surface of the structure.

At the step of FIG. 7, the parts of the structure that surround portion C3 are etched. Thus, the obtained capacitive element 264 corresponds to an isolated stack formed by layers 120, 220 and 240 located only in portion C3. As an example, all the regions located outside portion C3 on insulator 106 of the concerned trench 104 are removed. In other words, the sides of stack 264 correspond to the superimposed sides of layers 120, 220 and 240, and correspond to the edge of portion C3. The sides of each layer 120, 220 and 240 are not covered with portions of conductive layer. At a next step, not shown, the sides of stack 710 may be covered with an electrical insulator.

In other embodiments, layer 240 may be etched so that a part of layer 240 remains on the sides of layer 120 and/or on portion 510 and/or portion 610, leaving portions 510 and/or 610 in place. However, the upper corner of layer 120 would then be surrounded by layer 240 and insulated from layer 240 only by layer 220 and portions 510 and 610. This would result in a tip effect that would reduce the breakdown voltage of the capacitor. Likewise, the presence of portions 510 may result in a lower breakdown voltage and/or a higher noise level of the capacitor. By comparison, the method of FIGS. 4 to 7 allows the problems caused by the upper corners of layer 120 and by portions 510 and 610 to be avoided.

Figure 8:
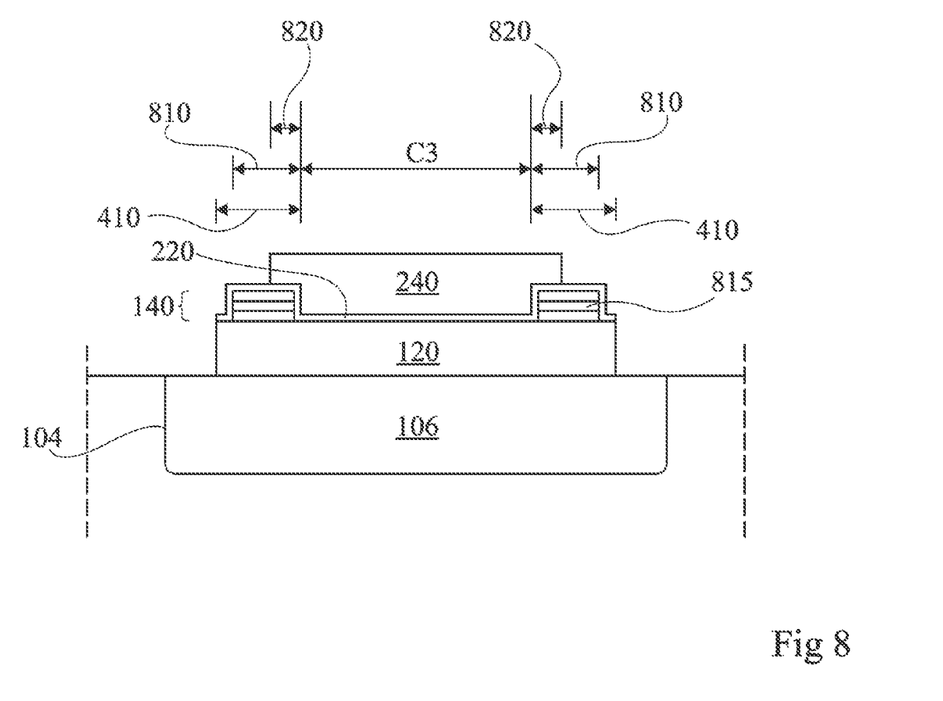
FIG. 8 is a cross-section view schematically showing a structure of an electronic chip obtained by an embodiment of a method for forming the capacitive component.

FIG. 8 is a cross-section view schematically showing a structure of electronic chip obtained by an embodiment of a method for forming the capacitive component. As an example, the capacitive component is capacitive component 264 of the method of FIGS. 1A-2F, located in portion C3 of the electronic chip. Like the method of FIGS. 4 to 7, the method of FIG. 8 focuses more particularly on forming and removing the elements located outside portion C3.

At a step corresponding to step S2 of FIG. 1B, layer 120 is in portion C3. Layer 120 extends across the whole of portion C3 and preferably extends over a part of insulator 106 outside portion C3 (portions 410).

At a step corresponding to step S3 of FIG. 1C, three-layer structure 140 is formed inside and outside portion C3. Three-layer structure 140 is formed on the portion of layer 120 located inside portion C3 and is formed also on insulator 106 of trenches 104, preferably in contact with insulator 106. Three-layer structure 140 may be deposited over the entire upper surface of the structure obtained at step S2. Next, three-layer structure 140 is etched inside portion C3 and outside an annular portion 810 of the electronic chip, surrounding portion C3, thus leaving an annular portion 815 of three-layer structure 140 surrounding portion C3.

At a step corresponding to step S5 of FIG. 2B, silicon oxide layer 220 is formed on layer 120. Silicon oxide layer 220 may extend outside portion C3 on annular portions 815 of three-layer structure 140.

At a step corresponding to step S6 of FIG. 2C, conductive layer 240 is formed in portion C3 and in an annular portion 820 extending around portion C3, for example from the perimeter of portion C3. Annular portion 820 of the electronic chip may correspond to an inner part of annular portion 810. Layer 240 may be formed only inside portions C3 and 820, or may be formed both inside and outside portions C3 and 820 and removed outside portions C3 and 820. This results in a portion of conductive layer 240, located only in portions C3 and 820. In the resulting capacitive element, the periphery of the portion of conductive layer 240 is separated from the portion of conductive layer 120 by annular portion 815 of three-layer structure 140.

Various embodiments and variations have been described. It will be understood by those skilled in the art that certain features of these various embodiments and variations may be combined, and other variations will occur to those skilled in the art. As an example, each of the methods of FIGS. 4 to 7 and the method of FIG. 8 may be applied to capacitive component 262 located in portion C2, instead of capacitive component 264. In another example, the method of FIGS. 4 to 7 is applied simultaneously to capacitive components 262 and 264.

Finally, the practical implementation of the described embodiments and variations is within the abilities of those skilled in the art based on the functional indications given hereinabove.

Such alterations, modifications, and improvements are intended to be part of this disclosure, and are intended to be within the spirit and the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A capacitive component comprising:
a semiconductor substrate;
a trench in the semiconductor substrate;
a silicon oxide layer vertically in line with the trench;
first and second conductive layers including polysilicon or amorphous silicon, the silicon oxide layer being between and in contact with the first and second conductive layers;
an insulating layer in the trench, wherein the insulating layer lines walls of the trench; and
a polysilicon wall separated from the substrate by the insulating layer.

2. The capacitive component of claim 1, wherein the first conductive layer is located vertically in line with the second conductive layer.

3. The capacitive component of claim 1, wherein the silicon oxide layer and the first and second conductive layers form a stack.

4. The capacitive component of claim 3, wherein sides of the silicon oxide layer and the first and second conductive layers correspond to sides of said stack.

5. The capacitive component of claim 3, wherein said stack is entirely located above the trench.

6. The capacitive component of claim 1, wherein the insulating layer entirely fills the trench.

7. The capacitive component of claim 1, wherein the first conductive layer includes a periphery, the capacitive component further comprising:
an annular oxide-nitride-oxide structure separating the periphery of the first conductive layer from the second conductive layer.

8. An electronic chip comprising:
a semiconductor substrate;
a first capacitive component, the first capacitive component including:
a first trench in the semiconductor substrate;
a first silicon oxide layer vertically in line with the first trench; and
first and second conductive layers including polysilicon or amorphous silicon, the first silicon oxide layer being between and in contact with the first and second conductive layers; and
a second capacitive component, the second capacitive component including:
a second trench in the semiconductor substrate;
a second silicon oxide layer vertically in line with the second trench; and
third and fourth conductive layers including polysilicon or amorphous silicon, the second silicon oxide layer being between and in contact with the third and fourth conductive layers, and the first and second silicon oxide layers having different thicknesses.

9. The chip of claim 8, further comprising a transistor gate a portion of the first silicon oxide layer.

10. The chip of claim 8, wherein the second capacitive component includes:
a first oxide-nitride-oxide three-layer structure between the third and fourth conductive layers.

11. The chip of claim 10, comprising a memory cell that includes a floating gate, a control gate, and a second oxide nitride-oxide three-layer structure located between the floating and control gates, the floating and control gates including fifth and sixth conductive layers.

12. The electronic chip of claim 8, comprising an insulating layer in the first trench.

13. The electronic chip of claim 12, wherein the insulating layer lines walls of the first trench.

14. The electronic chip of claim 12, comprising a polysilicon wall separated from the semiconductor substrate by the insulating layer.

15. The electronic chip of claim 12, wherein the insulating layer entirely fills the first trench.

16. A method, comprising:
forming a capacitive component, including:
forming a trench in a semiconductor substrate;
simultaneously forming a first portion of a first conductive layer and a second portion of the first conductive layer, the first portion of the first conductive layer being vertically in line with the trench and including polysilicon or amorphous silicon, the second portion of the first conductive layer being a floating gate of a memory cell;
forming a first portion of a silicon oxide layer on the first portion of the first conductive layer and vertically in line with the trench; and
forming a first portion of a second conductive layer that includes polysilicon or amorphous silicon, the first portion of the silicon oxide layer being between and in contact with the first portions of the first and second conductive layers.

17. The method of claim 16, wherein the first portions of the silicon oxide layer and the first and second conductive layers form a stack, the stack being obtained from the silicon oxide layer and the first and second conductive layers by etching regions surrounding the stack.

18. The method of claim 16, wherein the first portion of the first conductive layer includes a periphery, the method further comprising:
forming an annular oxide-nitride-oxide structure separating the periphery of the first portion of the first conductive layer from the first portion of the second conductive layer.

19. The method of claim 16, comprising simultaneously forming the first portion of the silicon oxide layer and a second portion of the silicon oxide layer, the second portion of the silicon oxide layer being a gate insulator of a transistor.

20. The method of claim 16, comprising simultaneously forming the first portion of the second conductive layer and a second portion of the second conductive layer, the second portion of the second conductive layer being a transistor gate.

* * * * *